(12) United States Patent
Takeda et al.

(10) Patent No.: US 7,202,592 B2
(45) Date of Patent: Apr. 10, 2007

(54) PIEZOELECTRIC TRANSFORMER, POWER SUPPLY CIRCUIT AND LIGHTING UNIT USING THE SAME

(75) Inventors: Katsu Takeda, Osaka-fu (JP); Hiroshi Nakatsuka, Osaka-fu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 362 days.

(21) Appl. No.: 10/843,015

(22) Filed: May 11, 2004

(65) Prior Publication Data

US 2004/0227434 A1 Nov. 18, 2004

(30) Foreign Application Priority Data

May 16, 2003 (JP) .............. P2003-138815

(51) Int. Cl.
*H02N 1/04* (2006.01)
(52) U.S. Cl. .............. 310/357; 310/369; 310/316.01
(58) Field of Classification Search .............. 310/359, 310/348, 351, 369, 357–358, 365–366, 311, 310/316.01, 317, 319; 313/309; 315/224; *H01L 41/16, H01L 41/08, 41/24*
See application file for complete search history.

(56) References Cited

U.S. PATENT DOCUMENTS 5,440,195 A * 8/1995 Ohnishi et al. .............. 310/359
5,751,092 A * 5/1998 Abe .............. 310/366
5,814,922 A * 9/1998 Uchino et al. .............. 310/359
5,998,937 A * 12/1999 Nishigaki .............. 315/209 PZ
6,333,598 B1 * 12/2001 Hsu et al. .............. 313/309
7,075,217 B2 * 7/2006 Vazquez Carazo .......... 310/359

FOREIGN PATENT DOCUMENTS

| JP | 4-167504 | 6/1992 |
|----|----------|--------|
| JP | 11-317553 | 11/1999 |
| JP | 2001-298221 | 10/2001 |

* cited by examiner

*Primary Examiner*—Darren Schuberg
*Assistant Examiner*—Karen Addison
(74) *Attorney, Agent, or Firm*—RatnerPrestia

(57) ABSTRACT

A piezoelectric transformer includes a piezoelectric ceramic disc having one face and the other face opposite to each other in a thickness direction. A pair of low-impedance portions acting as one of a driving portion and a generator portion are disposed in the piezoelectric ceramic disc symmetrically with respect to a central axis of the piezoelectric ceramic disc, while a pair of high-impedance portions acting as the other of the driving portion and the generator portion are disposed in the piezoelectric ceramic disc symmetrically with respect to the central axis so as to be electrically separated from the low-impedance portions such that the piezoelectric transformer is driven in a radial extensional vibration mode of the piezoelectric ceramic disc.

13 Claims, 16 Drawing Sheets

Fig. 8
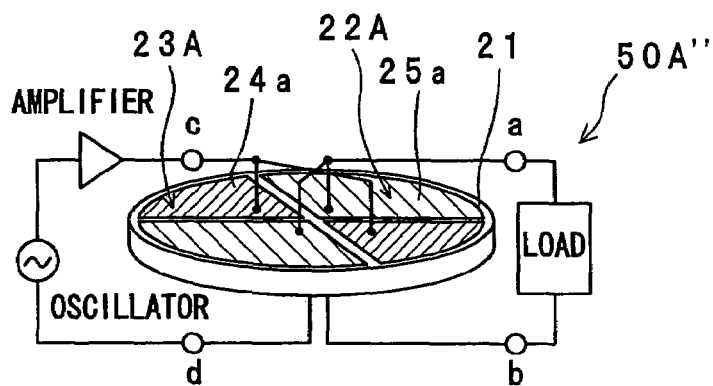
Fig. 9A
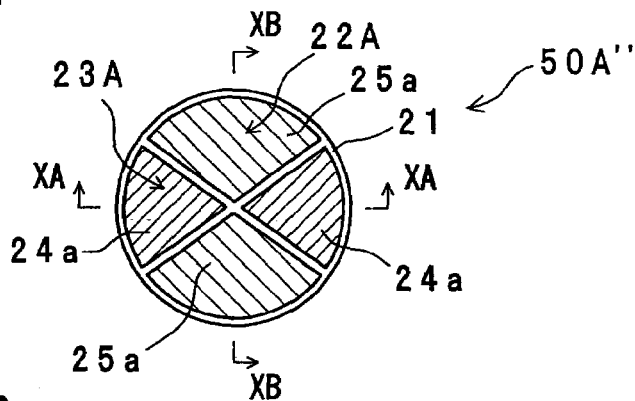
Fig. 9B
Fig. 10A
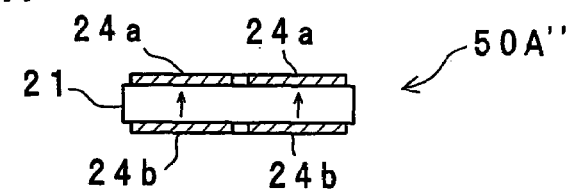
Fig. 10B
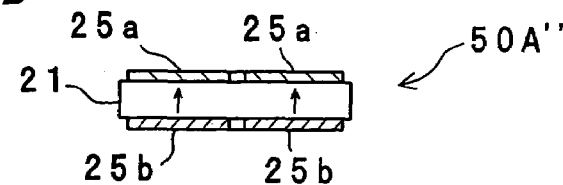

Fig. 26 PRIOR ART
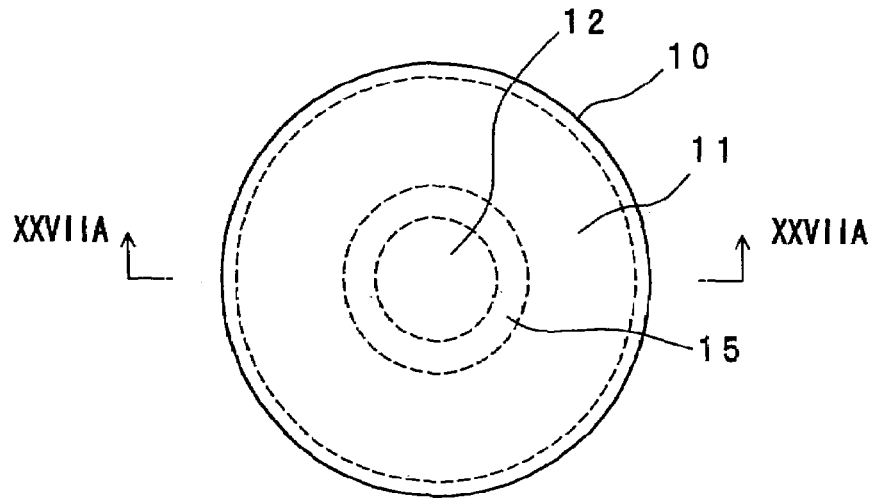
Fig. 27A PRIOR ART
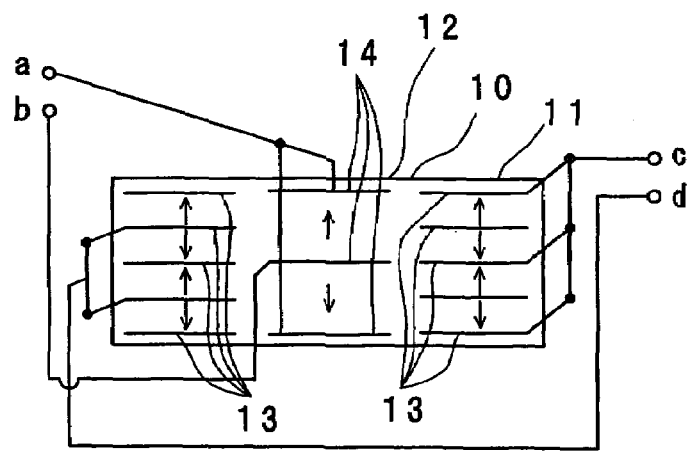
Fig. 27B PRIOR ART    STRESS DISTRIBUTION
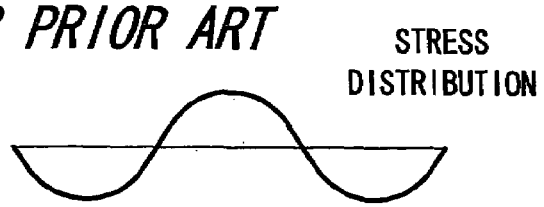
Fig. 27C PRIOR ART    DISPLACEMENT DISTRIBUTION
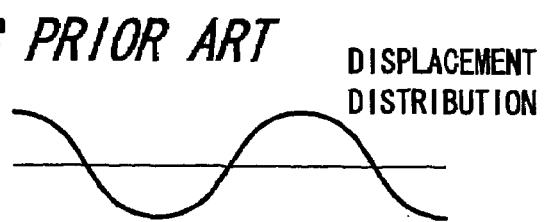

PIEZOELECTRIC TRANSFORMER, POWER SUPPLY CIRCUIT AND LIGHTING UNIT USING THE SAME

BACKGROUND OF THE INVENTION

1. Field of the Invention

The present invention generally relates to a piezoelectric transformer and more particularly, to an improved piezoelectric transformer which is made compact and is capable of yielding a large output. The present invention also relates to a power supply circuit employing the piezoelectric transformer and a lighting unit employing the piezoelectric transformer.

2. Description of the Prior Art

Since power density per unit volume of a piezoelectric transformer is larger than that of an electromagnetic transformer, the piezoelectric transformer can be made compact and thin. Furthermore, in the piezoelectric transformer, since power conversion is performed by exciting mechanical resonant vibration based on inverse piezoelectric effect, high conversion efficiency can be obtained. Thus, in recent years, the piezoelectric transformer is used for a switching power supply in order to make a power supply circuit of an electronic appliance compact.

FIG. 24 is a perspective view of a conventional Rosen type piezoelectric transformer 1. The conventional piezoelectric transformer 1 includes a rectangular plate 2 made of piezoelectric material. In FIG. 24, electrodes 3 and 4 are, respectively, formed on opposite faces of a substantially left haft portion of the rectangular plate 2 and act as electrodes for a driving portion (an input side), while an electrode 5 for a generator portion (an output side) is formed on one end face of the rectangular plate 2. In case the rectangular plate 2 is made of piezoelectric ceramic material such as lead zirconate titanate (PZT), the left half portion of the rectangular plate 2 is polarized in a thickness direction as shown by the arrow A. The polarization operation is performed by using the electrodes 3 and 4. The right half portion of the rectangular plate 2 is polarized in a lengthwise direction as shown by the arrow B by using the electrodes 3, 4 and 5.

Here, an AC voltage close to a resonance frequency for exciting mechanical vibration of expansion and contraction in the lengthwise direction of the rectangular plate 2 is applied between the electrodes 3 and 4 by using the electrode 4 as a common electrode. Thus, in the piezoelectric transformer 1, the mechanical vibration of expansion and contraction in the lengthwise direction of the rectangular plate 2 is excited. Electric charge is induced between the electrodes 5 and 4 at the generator portion from this mechanical vibration by piezoelectric effect. In accordance with a ratio of an impedance obtained by the electrodes 5 and 4 for the generator portion to an impedance obtained by the electrodes 3 and 4 for the driving portion, a high voltage to which a voltage applied between the electrodes 3 and 4 for the driving portion is raised is picked up between the electrodes 5 and 4 for the generator portion.

However, in the conventional piezoelectric transformer 1 utilizing mechanical vibration of expansion and contraction in the lengthwise direction of the rectangular plate 2, it is difficult to cause flow of large electric current due to its structure and vibration mode as follows. FIG. 25A is a sectional view of the conventional piezoelectric transformer 1 taken along the line XXVA—XXVA in FIG. 24. If the conventional piezoelectric transformer 1 is subjected to (½)—wavelength vibration of expansion and contraction in the lengthwise direction, FIG. 25B shows displacement distribution in the lengthwise direction at a time point, FIG. 25C shows internal stress distribution in the rectangular plate 2 forming the piezoelectric transformer 1 and FIG. 25D shows electric charge distribution induced on a plane perpendicular to the thickness direction of the rectangular plate 2 by the vibration. Meanwhile, in FIG. 25B, the ordinate axis represents vibratory displacement and has signs "+" and "−" corresponding to rightward displacement and leftward displacement in FIG. 25A, respectively.

Generally, in a Rosen type piezoelectric transformer, electric charge is induced by vibration of lengthwise expansion and contraction and is outputted as electric current in accordance with magnitude of distortion caused by vibration of expansion and contraction and area of an electrode for a generator portion. However, in the conventional piezoelectric transformer 1 shown in FIG. 24, since area of the electrode 5 for the generator portion is small, it is difficult to obtain large electric current. Thus, in order to obtain larger electric current from the conventional piezoelectric transformer 1, amplitude of mechanical vibration should be increased so as to further distort the rectangular plate 2. However, in case the rectangular plate 2 of the piezoelectric transformer 1 is made of piezoelectric ceramic material, mechanical strength of a portion 2a where polarization direction is discontinuous is weaker than that of a portion having continuous polarization direction. As shown in FIGS. 25A and 25C, a portion where large stress is generated during ordinary operation substantially coincides with the portion 2a having discontinuous polarization direction in the Rosen type piezoelectric transformer 1. Hence, if amplitude of mechanical vibration increases upon increase of electric power handled by the piezoelectric transformer 1, large stress is applied to the portion 2a having discontinuous polarization direction and thus, cracks are likely to occur at the portion 2a. Therefore, the piezoelectric transformer employing the rectangular plate could not been used for applications in which large electric current is outputted.

Then, a piezoelectric transformer utilizing a radial extensional vibration mode of a disc has been proposed in, for example, Japanese Patent Laid-Open Publication No. 4-167504 (1992) so as to be used in applications for outputting large electric current. FIG. 26 is a schematic top plan view of a known piezoelectric transformer utilizing the radial extensional vibration mode of the disc, which has been proposed for use in applications for outputting large electric current. FIG. 27A is a sectional view taken along the line XXVIIA—XXVIIA in FIG. 26, while FIGS. 27B and 27C show stress distribution and vibration mode (vibratory displacement distribution) of the known piezoelectric transformer of FIG. 26, respectively. This known piezoelectric transformer utilizes third-order radial extensional vibration mode of a piezoelectric ceramic disc 10. At a central portion of the piezoelectric ceramic disc 10, a plurality of electrodes 14 are laminated in a thickness direction so as to form a high-impedance portion 12. An insulating annular portion 15 having no electrode is formed outside the high-impedance portion 12 and a low-impedance portion 11 in which a plurality of electrodes 13 are laminated in the thickness direction is further formed outside the insulating annular portion 15.

In order to impart piezoelectric property to the low-impedance portion 11 and the high-impedance portion 12, polarization operation is performed in the low-impedance portion 11 and the high-impedance portion 12. In the low-impedance portion 11 and the high-impedance portions 12, polarization directions in neighboring ones of layers partitioned by the respective electrodes in the thickness direction are opposite to each other as shown by the arrows in FIG. 27A. Assuming that the known piezoelectric transformer has electric input terminals a and b and electric output terminals c and d for voltage step-down purpose, the high-impedance portion 12 acts as a driving portion and the low-impedance portion 11 acts as a generator portion. In case an AC voltage is applied to the electric input terminals a and b, third-order radial extensional vibration of the piezoelectric ceramic disc 10 is excited in the known piezoelectric transformer and a step-down voltage can be picked up from the electric output terminals c and d. In the known piezoelectric transformer, since a portion where a large stress is generated during ordinary operation does not coincide with a portion where polarization is discontinuous, cracks are not readily produced even if amplitude of mechanical vibration is increased upon rise of electric power handled by the known piezoelectric transformer. The same applies also to drive utilizing a first-order radial extensional vibration mode of a disc.

However, in the known piezoelectric transformer utilizing the radial extensional vibration mode of the piezoelectric ceramic disc 10, since the high-impedance portion 12 disposed at the central portion of the piezoelectric transformer 10 has a laminated structure as shown in FIG. 27A, electrical connection becomes difficult and thus, an electrical connection structure becomes complicated disadvantageously.

SUMMARY OF THE INVENTION

Accordingly, an essential object of the present invention is to provide, with a view to eliminating the above mentioned drawbacks of prior art, a piezoelectric transformer in which electrical connection is easy and large electric current can be outputted.

Another important object of the present invention is to provide a piezoelectric transformer in which electric power per unit volume and output electric current can be increased.

Still another object of the present invention is to provide a piezoelectric transformer which has a high efficiency and a high electromechanical coupling factor.

An additional object of the present invention is to provide a piezoelectric transformer in which a ratio between an impedance of a low-impedance portion and that of a high-impedance portion can be increased by laminating piezoelectric layers and electrode layers alternately.

A still additional object of the present invention is to provide a piezoelectric transformer in which it is possible to restrain vibratory loss due to support, clamp or electrical connection.

A further object of the present invention is to provide a power supply circuit including the piezoelectric transformer.

A still further object of the present invention is to provide a lighting unit including the piezoelectric transformer.

In order to accomplish these objects of the present invention, a piezoelectric transformer according to the present invention includes a piezoelectric ceramic disc having one face and the other face opposite to each other in a thickness direction. A pair of low-impedance portions acting as one of a driving portion and a generator portion are disposed in the piezoelectric ceramic disc symmetrically with respect to a central axis of the piezoelectric ceramic disc, while a pair of high-impedance portions acting as the other of the driving portion and the generator portion are disposed in the piezoelectric ceramic disc symmetrically with respect to the central axis so as to be electrically separated from the low-impedance portions such that the piezoelectric transformer is driven in a radial extensional vibration mode of the piezoelectric ceramic disc.

BRIEF DESCRIPTION OF THE DRAWINGS

These objects and features of the present invention will become apparent from the following description taken in conjunction with the preferred embodiments thereof with reference to the accompanying drawings in which:

FIG. 8 is a perspective view showing a piezoelectric transformer which is a second modification of the piezoelectric transformer of FIG. 1;

FIGS. 9A and 9B are a top plan view and a bottom plan view of the piezoelectric transformer of FIG. 8, respectively;

FIGS. 10A and 10B are sectional views taken along the lines XA—XA and XB—XB in FIG. 9A, respectively;

FIG. 26 is a schematic top plan view of a further prior art piezoelectric transformer utilizing a third-order radial extensional vibration mode of a disc; and FIG. 27A is a sectional view taken along the line XXVIIA—XXVIIA in FIG. 26 and FIGS. 27B and 27C are views showing stress distribution and vibratory displacement distribution in the further prior art piezoelectric transformer of FIG. 26, respectively.

Before the description of the present invention proceeds, it is to be noted that like parts are designated by like reference numerals throughout several views of the accompanying drawings.

DETAILED DESCRIPTION OF THE INVENTION

Hereinafter, embodiments of the present invention are described with reference to the drawings.

(First Embodiment)

Figure 1:
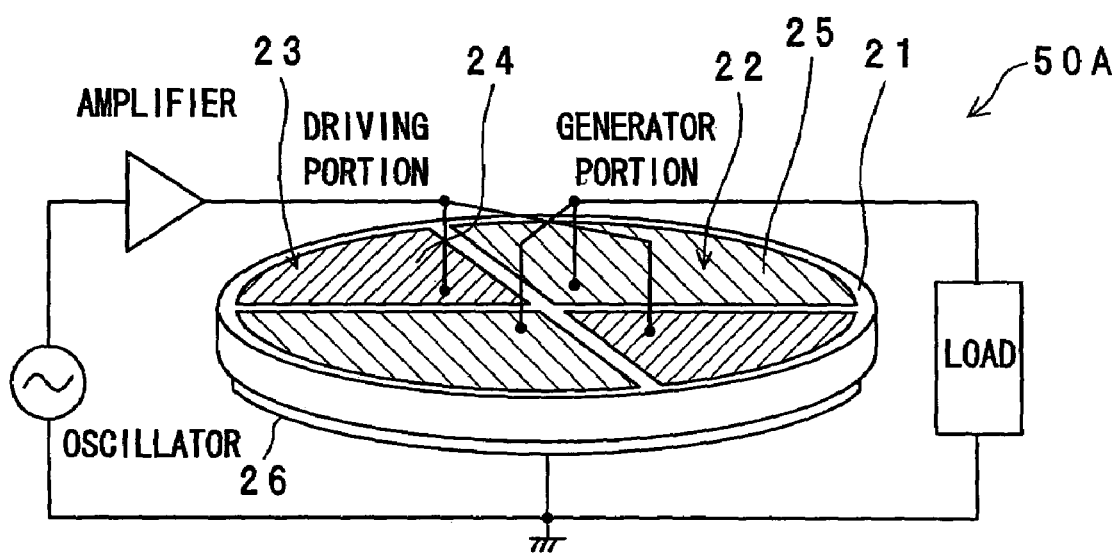
FIG. 1 is a perspective view of a piezoelectric transformer according to a first embodiment of the present invention.
Figure 2:
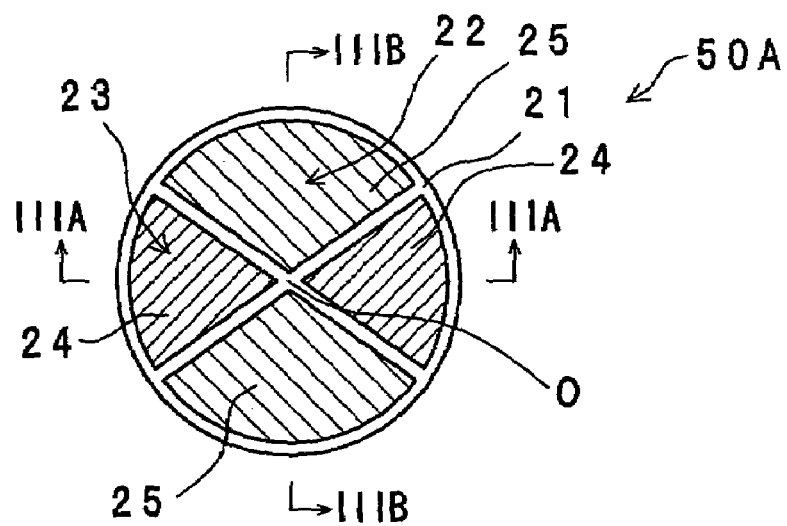
FIG. 2 is a top plan view of the piezoelectric transformer of FIG. 1.
Figure 3A:
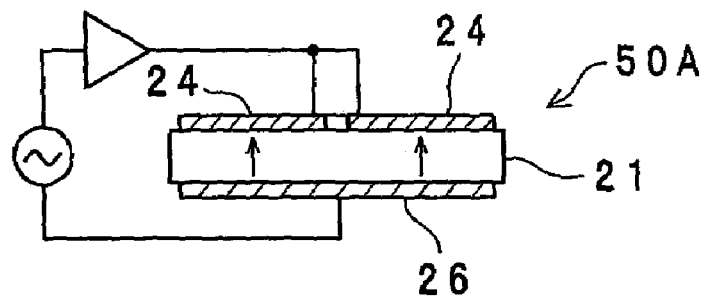
FIGS. 3A and 3B are sectional views taken along the lines IIIA—IIIA and IIIB—IIIB in FIG. 2, respectively.
Figure 3B:
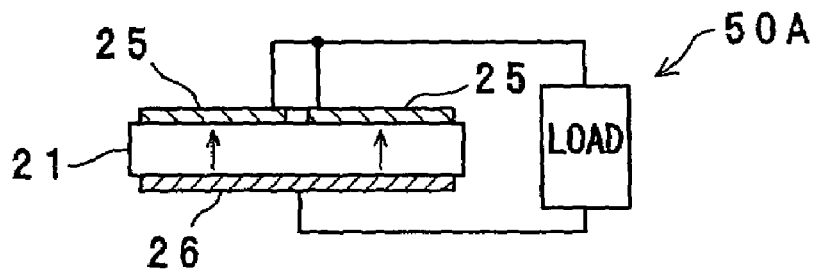

FIG. 1 is a perspective view of a piezoelectric transformer 50A according to a first embodiment of the present invention and FIG. 2 is a top plan view of the piezoelectric transformer 50A. FIGS. 3A and 3B are sectional views taken along the lines IIIA—IIIA and IIIB—IIIB in FIG. 2, respectively. As shown in these figures, the piezoelectric transformer 50A includes a piezoelectric ceramic disc 21 having one face and the other face opposite to each other in a thickness direction. A pair of low-impedance portions 22 acting as a generator portion or a driving portion are disposed in the piezoelectric ceramic disc 21 symmetrically with respect to a central axis of the piezoelectric ceramic disc 21. Furthermore, a pair of high-impedance portions 23 acting as the driving portion or the generator portion are disposed in the piezoelectric ceramic disc 21 symmetrically with respect to the central axis of the piezoelectric ceramic disc 21 so as to be electrically separated from the low-impedance portions 22.

The high-impedance portions 23 include a pair of electrodes 24 which are provided at, for example, the driving portion on the one face of the piezoelectric ceramic disc 21 symmetrically with respect to the central axis of the piezoelectric ceramic disc 21. Meanwhile, the low-impedance portions 22 include a pair of electrodes 25 which are provided at, for example, the generator portion on the one face of the piezoelectric ceramic disc 21 symmetrically with respect to the central axis of the piezoelectric ceramic disc 21. A common electrode 26 is provided on the other face of the piezoelectric ceramic disc 21. Each of the electrodes 24 at the driving portion extends radially from the central axis towards a peripheral edge of the piezoelectric ceramic disc 21 on the one face of the piezoelectric ceramic disc 21. Similarly, each of the electrodes 25 at the generator portion extends radially from the central axis towards the peripheral edge of the piezoelectric ceramic disc 21 on the one face of the piezoelectric ceramic disc 21. Meanwhile, the common electrode 26 is formed on a whole of the other face of the piezoelectric ceramic disc 21 so as to correspond in position to the electrodes 24 and the electrodes 25.

By adjusting a ratio between an area occupied by the electrodes 24 at the driving portion and an area occupied by the electrodes 25 at the generator portion on the one face of the piezoelectric ceramic disc 21, it is possible to adjust a ratio between an impedance of the high-impedance portions 23 at the driving portion and an impedance of the low-impedance portions 22 at the generator portion. As shown in FIG. 2, the area occupied by the electrodes 25 is so set as to be larger than the area occupied by the electrodes 24. By setting to a large value the area occupied by the electrodes 25 at the generator portion, output current can be increased.

Figure 4:
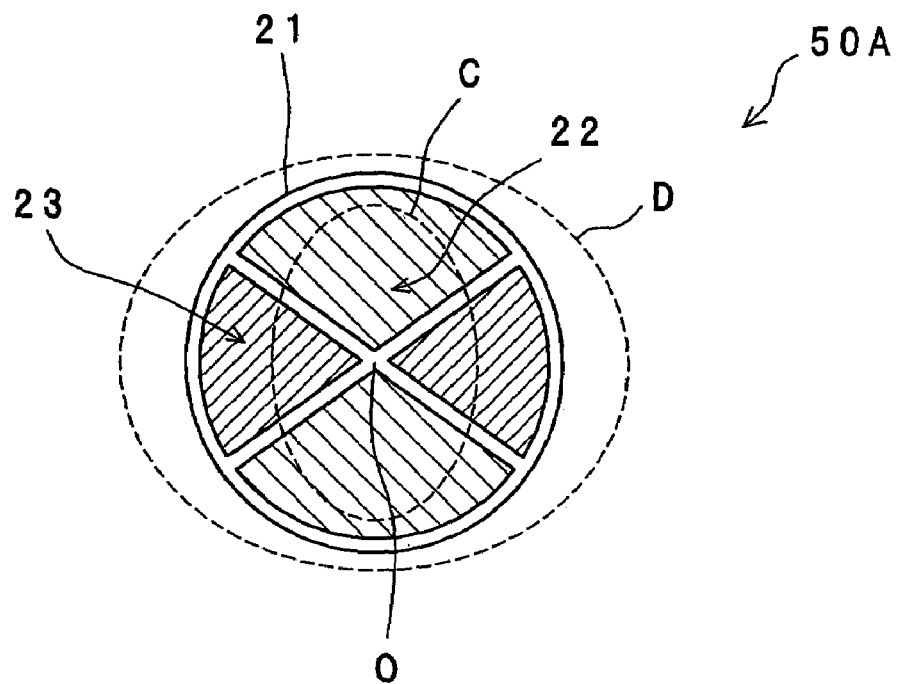
FIG. 4 is a view showing vibratory mode of a piezoelectric ceramic disc of the piezoelectric ceramic transformer of FIG. 1.

Since the piezoelectric transformer 50A is adapted to be driven in, for example, a first-order radial extensional vibration mode of the piezoelectric ceramic disc 21, the piezoelectric ceramic disc 21 is vibrated so as to repeat a vibration configuration shown by the elliptic curve C and a vibration configuration shown by the elliptic curve D in FIG. 4. In this case, a node of the vibration is located at a central portion O of the piezoelectric ceramic disc 21.

In radial extensional vibration of a disc, if an electrode is formed on a whole face of the disc, resonant vibration in which expansion proceeding uniformly from a center of the disc radially and contraction are repeated is performed without any expansion and contraction in a thickness direction of the disc, an electromechanical coupling factor kp is expressed by the following equation:

$$kp = k31\sqrt{\{2/(1-\sigma_E)\}}$$

in which "$\sigma_E$" denotes a Poisson's ratio and "k31" denotes an electromechanical coupling factor in a lengthwise transverse effect longitudinal vibration mode of a rectangular plate.

In general elastic members, since the Poisson's ratio is about 0.3, the electromechanical coupling factor in the radial extensional vibration mode of the disc is larger than that in the lengthwise transverse effect longitudinal vibration mode of the rectangular plate. Therefore, in case radial extensional vibration is employed as in this embodiment, ratio of energy conversion from electrical energy to mechanical energy in one vibration rises, so that the electromechanical coupling factor increases and thus, electric power per unit volume and output electric current can be increased.

In a piezoelectric member, distortion is generated by inverse piezoelectric effect only at a portion where an electrode is formed and electric field is applied to the electrode, while distortion based on inverse piezoelectric effect is not generated at a portion having no electrode. Therefore, in case an electrode of a driving portion is formed on a principal face of the piezoelectric member and area of the electrode of the driving portion is reduced, without changing shape of the piezoelectric member, to a state shown in FIG. 1 from a state in which the electrode of the driving portion is formed on a whole of the principal face of the piezoelectric member, a portion which does not have the electrode acts, for a portion having the electrode, as a load for hampering vibration. Furthermore, in this case, other vibrations than that to be excited, i.e., radial extensional vibration of a disc may be readily excited and energy is consumed for these other vibrations. As a result, if area of the electrode of the driving portion is reduced from the state in which the electrode of the driving portion is formed on the whole principal face of the piezoelectric member, electromechanical coupling factor for resonant vibration to be excited decreases. The electromechanical coupling factor at this time is referred to as an "effective electromechanical coupling factor keff" so as to be distinguished from that for the state in which the electrode of the driving portion is formed on the whole principal face of the piezoelectric member. Namely, when a piezoelectric transformer is evaluated, the effective electromechanical coupling factor keff including structural factors such as shape of the electrode plays a vital role instead of an electromechanical coupling factor kp which is an intrinsic value of the piezoelectric material.

The piezoelectric transformer as a whole is subjected to resonant vibration by inverse piezoelectric effect by applying AC power to the electrode of the driving portion, i.e., an input side and electric charge generated in an electrode of a generator portion, i.e., an output side by piezoelectric effect is picked up such that an output voltage from the electrode of the generator portion is raised or lowered in accordance with a ratio of an impedance of the electrode of the generator portion to that of the electrode of the driving portion. Hence, the electrode of the driving portion should be formed as large as possible in order to excite piezoelectric vibration efficiently. However, generally, when electrode construction is considered in the piezoelectric transformer, it is obligatory to form the electrode of the driving portion not wholly but partially on the piezoelectric transformer. Therefore, in order to increase mechanical vibration in response to an electrical input, it is preferable that the effective electromechanical coupling factor keff based on the electrode of the driving portion should be increased by setting area and location of the electrode of the driving portion properly.

In case an identical vibration is excited in discs of an identical volume, the effective electromechanical coupling factor keff decreases as area of the electrode of the driving portion is smaller in the same manner as a rectangular plate. On the other hand, in case the disc is expanded and contracted symmetrically with respect to its center as radial extensional vibration, the effective electromechanical coupling factor keff increases towards the electromechanical coupling factor kp when the electrode of the driving portion, having an identical area, is disposed symmetrically with respect to the center of the disc.

Figure 5:
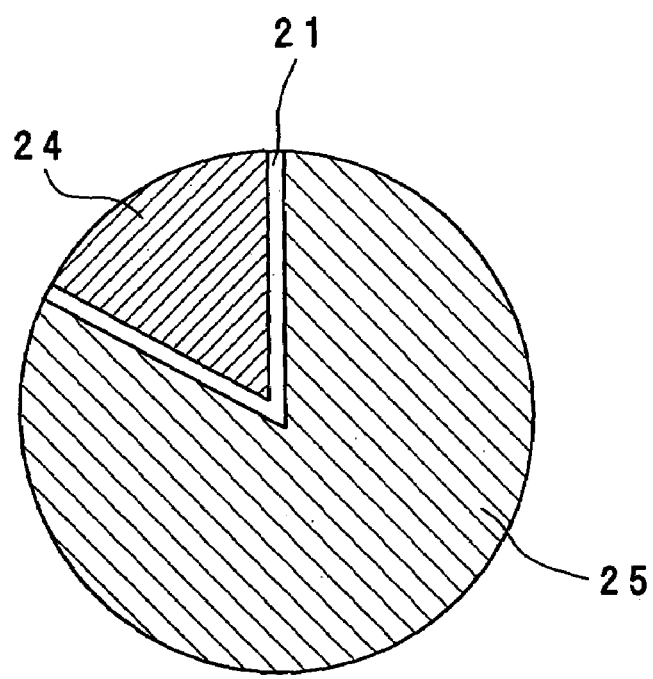
FIG. 5 is a top plan view of a piezoelectric transformer which is a comparative example of the piezoelectric transformer of FIG. 1.

In this embodiment, since a pair of the electrodes 24 at the driving portion 24 are provided on the one face of the piezoelectric ceramic disc 21 symmetrically with respect to the central axis of the piezoelectric ceramic disc 21, the effective electromechanical coupling factor keff based on the electrodes 24 of the driving portion is larger than that of a comparative piezoelectric transformer of FIG. 5 in which the electrode 24 of the driving portion is formed on the piezoelectric ceramic disc 21 asymmetrically.

Figure 6:
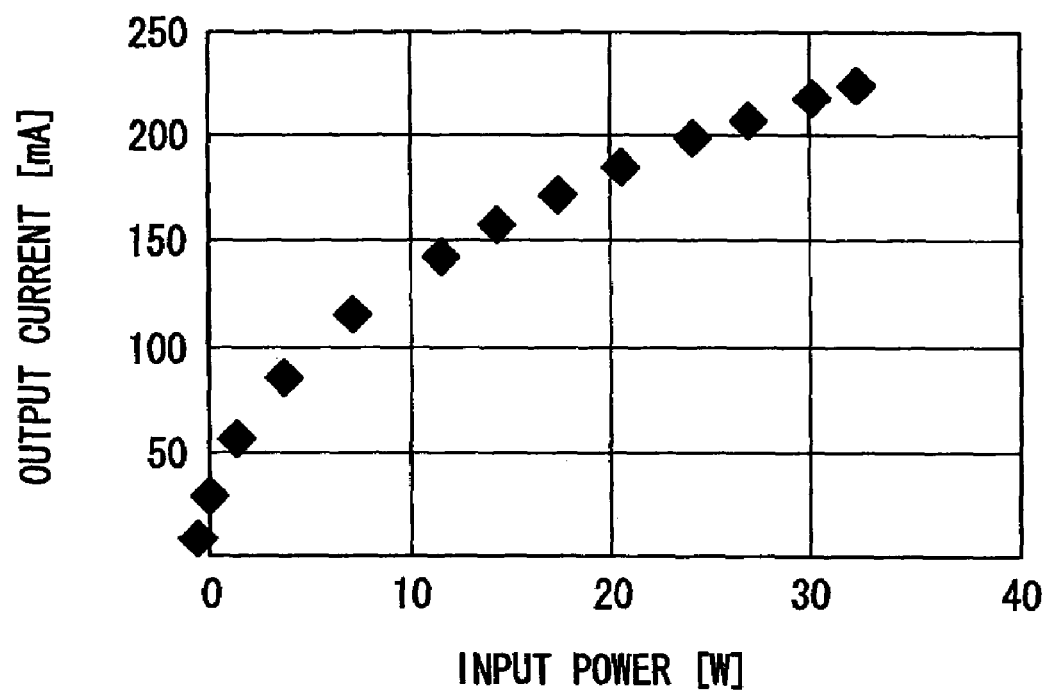
FIG. 6 is a graph showing relation between input power and output current in the piezoelectric transformer of FIG. 1.

FIG. 6 shows output current relative to input power at the time a step-down ratio reaches a maximum of (1:2) in response to input power close to that for actual use. These data were obtained by driving the piezoelectric transformer of FIG. 1 in the first-order radial extensional vibration mode of the piezoelectric ceramic disc 21 having a volume of $1.06 \times 10^{-6}$ m$^3$. A ratio of an area of a pair of the electrodes 24 at the driving portion to that of a pair of the electrodes 25 at the generator portion is (1:2). At the time of output of 300 W, driving efficiency is 91% and current density is $1.4 \times 10^4$ A/m$^2$. Meanwhile, a Rosen type piezoelectric transformer has a current density of $4.5 \times 10^3$ A/m$^2$ at the time of output of 10 W.

In the piezoelectric transformer having the lengthwise transverse effect longitudinal vibration mode of k31 of the rectangular plate, since a step-up ratio can be raised to several times in the case of a single plate and 30 to 60 times on the basis of lamination in the case of a laminated structure but an output current is as small as several mA to several tens mA, it has been difficult to use this piezoelectric transformer for applications requiring large output current. However, in the piezoelectric transformer 50A of this embodiment, output current can be increased to several hundred mA or more. In, for example, a hot cathode tube such as an ordinary fluorescent lamp, 100 V from a commercial power supply is lowered to several tens V and electric current is used on the order of several hundred mA. Thus, by using the piezoelectric transformer 50A of this embodiment for step-down purpose, the piezoelectric transformer 50A can be applied to the hot cathode tube.

Meanwhile, the piezoelectric transformer 50A of this embodiment can be used for a DC/DC converter so as to handle its electric current and voltage.

Furthermore, in response to trends towards a larger screen and higher luminance of a liquid crystal display, a cold cathode tube becomes longer and requires a large electric current. In a 40-inch class liquid crystal display, several tens cold cathode tubes are used. Since output current is increased in the piezoelectric transformer 50A of this embodiment, a plurality of the cold cathode tubes can be turned on by the single piezoelectric transformer 50A.

In this embodiment, the piezoelectric transformer 50A is driven in the first-order radial extensional vibration mode of the piezoelectric ceramic disc 21 by way of example. However, the present invention is not limited to this vibration mode but the piezoelectric transformer 50A may be driven in a higher-order vibration mode. In FIG. 3B showing the piezoelectric transformer 50A, a load is provided between a pair of the electrodes 24 at the generator portion and the common electrode 26 and portions disposed immediately below a pair of the electrodes 25 have an identical polarization direction as shown by the arrows.

Figure 7:
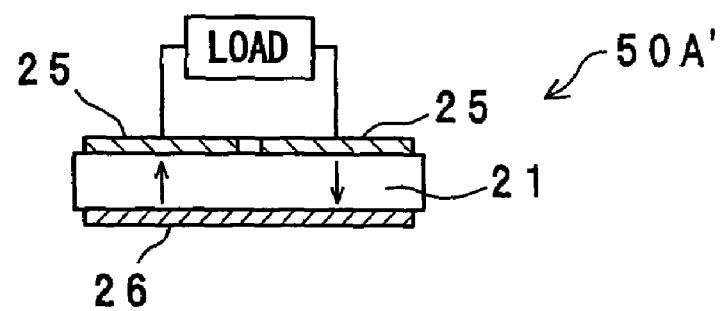
FIG. 7 is a sectional view showing a piezoelectric transformer which is a first modification of the piezoelectric transformer of FIG. 1.

FIG. 7 corresponds to FIG. 3B and shows a piezoelectric transformer 50A' which is a first modification of the piezoelectric transformer 50A. In FIG. 7, portions disposed immediately below a pair of the electrodes 25 in the piezoelectric ceramic disc 21 have opposite polarization directions as shown by the arrows and an output voltage twice that of the piezoelectric transformer 50A can be obtained by providing a load between a pair of the electrodes 25.

FIG. 8 shows a piezoelectric transformer 50A" which is a second modification of the piezoelectric transformer 50A. FIGS. 9A and 9B are a top plan view and a bottom plan view of the piezoelectric transformer 50A", respectively. Meanwhile, FIGS. 10A and 10B are sectional views taken along the lines XA—XA and XB—XB in FIG. 9A, respectively. The piezoelectric transformer 50A" is different from the piezoelectric transformer 50A in that the common electrode 26 provided on the other face of the piezoelectric ceramic disc 21 in the piezoelectric transformer 50A is divided as shown in FIG. 9B as follows. As shown in FIGS. 8 to 10, a pair of low-impedance portions 22A include a pair of first electrodes 25a which are provided on the one face of the piezoelectric ceramic disc 21 symmetrically with respect to the central axis of the piezoelectric ceramic disc 21. A pair of the first electrodes 25a are connected, in parallel, to a first terminal a acting as an electric current input-output port for the low-impedance portions 22A. Meanwhile, a pair of low-impedance portions 22B include a pair of second electrodes 25b which are provided on the other face of the piezoelectric ceramic disc 21 symmetrically with respect to the central axis of the piezoelectric ceramic disc 21. A pair of the second electrodes 25b are connected, in parallel, to a second terminal b acting as an electric current input-output port for the low-impedance portions 22B.

A pair of high-impedance portions 23A include a pair of third electrodes 24a which are provided on the one face of the piezoelectric ceramic disc 21 symmetrically with respect to the central axis of the piezoelectric ceramic disc 21. A pair of the third electrodes 24a are electrically separated from a pair of the first electrodes 25a and are connected, in parallel, to a third terminal c acting as an electric current input-output port for the high-impedance portions 23A. Meanwhile, a pair of high-impedance portions 23B include a pair of fourth electrodes 24b which are provided on the other face of the piezoelectric ceramic disc 21 symmetrically with respect to the central axis of the piezoelectric ceramic disc 21. A pair of the fourth electrodes 24b are electrically separated from a pair of the second electrodes 25b and are connected, in parallel, to a fourth terminal d acting as an electric current input-output port for the high-impedance portions 23B.

In the piezoelectric transformer 50A'', the second electrodes 25b of the low-impedance portions 22B are electrically separated from the fourth electrodes 24b of the high-impedance portions 23B on the other face of the piezoelectric ceramic disc 21. Thus, even if a noisy signal is introduced in, for example, between the third electrodes 24a of the high-impedance portions 23A and the fourth electrodes 24b of the high-impedance portions 23B, the noise is not picked up between the first electrodes 25a of the low-impedance portions 22A and the second electrodes 25b of the low-impedance portions 22B. Each of the first electrodes 25a extends radially from the central axis towards a peripheral edge on the one face of the piezoelectric ceramic disc 21. Each of the second electrodes 25b extends radially from the central axis towards the peripheral edge on other face of the piezoelectric ceramic disc 21. Each of the third electrodes 24a extends radially from the central axis towards the peripheral edge on the one face of the piezoelectric ceramic disc 21. Each of the fourth electrodes 24b extends radially from the central axis towards the peripheral edge on the other face of the piezoelectric ceramic disc 21.

In this embodiment, surfaces of the piezoelectric ceramic disc 21 can be utilized effectively by forming the electrodes of the driving portion and the electrodes of the generator portion radially and the effective electromechanical coupling factor keff can be increased further.

(Second Embodiment)

Figure 11A:
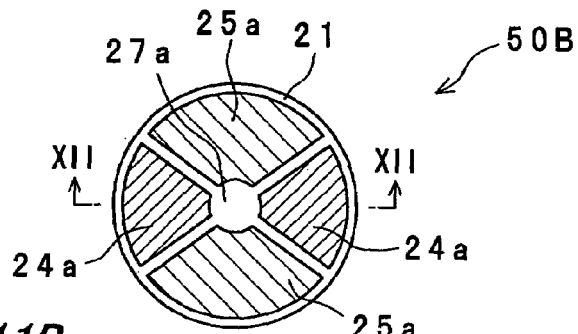
FIGS. 11A and 11B are a top plan view and a bottom plan view of a piezoelectric transformer according to a second embodiment of the present invention, respectively.
Figure 11B:
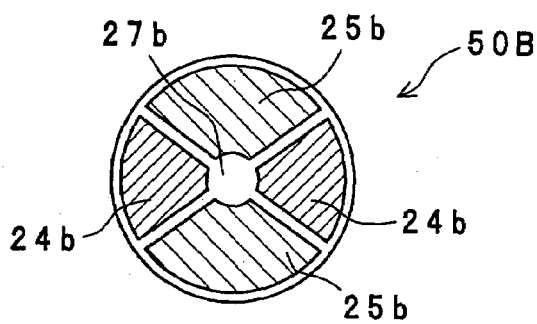
Figure 12:
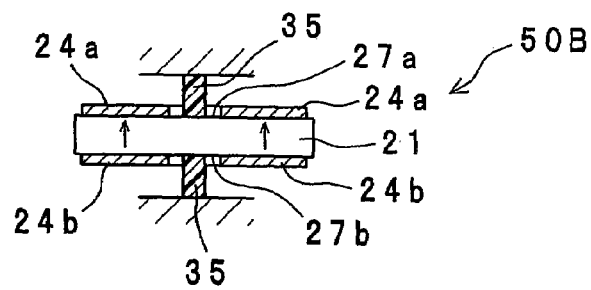
FIG. 12 is a sectional view taken along the line XII—XII in FIG. 11A.

FIGS. 11A and 11B are a top plan view and a bottom plan view of a piezoelectric transformer 50B according to a second embodiment of the present invention, respectively. FIG. 12 is a sectional view taken along the line XII—XII in FIG. 11A. The piezoelectric transformer 50B is different from the piezoelectric transformer 50A'' of FIG. 8 in the following points. Namely, as shown in FIGS. 11 and 12, a circular region 27a which is not formed with the first electrodes 25a and the third electrodes 24a is provided at a central portion on the one face of the piezoelectric ceramic disc 21 so as to be brought into contact with a support member 35 and a circular region 27b which is not formed with the second electrodes 25b and the fourth electrodes 24b is provided at a central portion on the other face of the piezoelectric ceramic disc 21 so as to be brought into contact with a further support member 35.

Figure 13A:
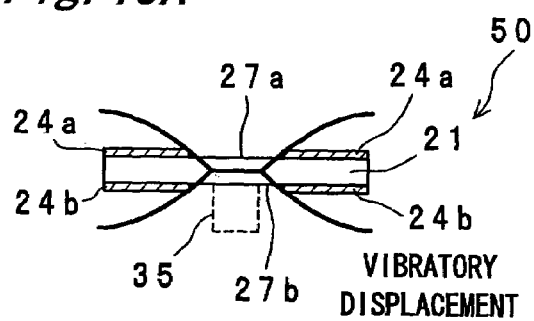
FIGS. 13A and 13B are views showing vibratory displacement distribution in the piezoelectric transformer of FIG. 12 and vibratory displacement distribution in a piezoelectric transformer which is a comparative example of the piezoelectric transformer of FIG. 12, respectively.
Figure 13B:
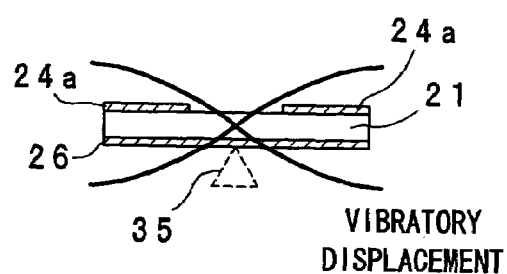

FIG. 13B shows a comparative piezoelectric transformer of the piezoelectric transformer 50B. In case the common electrode 26 is formed on the whole of the other face of the piezoelectric ceramic disc 21 in the same manner as the piezoelectric transformer 50A as shown in FIG. 13B, a node of vibratory displacement is formed at a point. Therefore, in this case, in order to support the piezoelectric transformer by the support member 35 without hampering vibration, the support member 35 should support the piezoelectric transformer at one point corresponding to the node of vibratory displacement. Thus, if contact area between the support member 35 and the piezoelectric transformer is increased even slightly, vibration is hampered.

On the other hand, as shown in FIG. 13A on the piezoelectric transformer 50B, if the circular region 27b which is not formed with the second electrodes 25b and the fourth electrodes 24b is provided on the other face of the piezoelectric ceramic disc 21, a node of vibratory displacement can be formed flat for the following reason. Namely, in a piezoelectric member, distortion is generated by inverse piezoelectric effect only at a portion where an electrode is formed and electric field is applied to the electrode, while distortion based on inverse piezoelectric effect is not generated at a portion having no electrode. Therefore, the support member 35 can be brought into contact with the flat portion corresponding to the node of vibratory displacement, so that contact area between the support member 35 and the piezoelectric ceramic disc 21 can be increased. As a result, the support member 35 is capable of supporting the piezoelectric transformer 50B stably without hampering vibration.

Meanwhile, as shown in FIG. 11B, the electrode formed on the other face of the piezoelectric ceramic disc 21 is divided into the electrodes 24b for the driving portion and the electrodes 25b for the generator portion and the electrodes 24b are electrically separated from the electrodes 25b. By the above described arrangement of the piezoelectric transformer 50B, even if a noisy signal is introduced in, for example, between the electrodes 24a and 24b for the driving portion, the noise is not picked up between the electrodes 25a and 25b for the generator portion.

Meanwhile, in this embodiment, the electrode formed on the other face of the piezoelectric ceramic disc 21 is divided into the electrodes 24b for the driving portion and the electrodes 25b for the generator portion and the electrodes 24b are electrically separated from the electrodes 25b. However, even if the electrodes 24b and the electrodes 25b is replaced by a common electrode which is formed on the whole of the other face of the piezoelectric ceramic disc 21 except for the circular region 27b, the support member 35 is capable of supporting the piezoelectric transformer 50B stably without hampering vibration.

(Third Embodiment)

Figure 14:
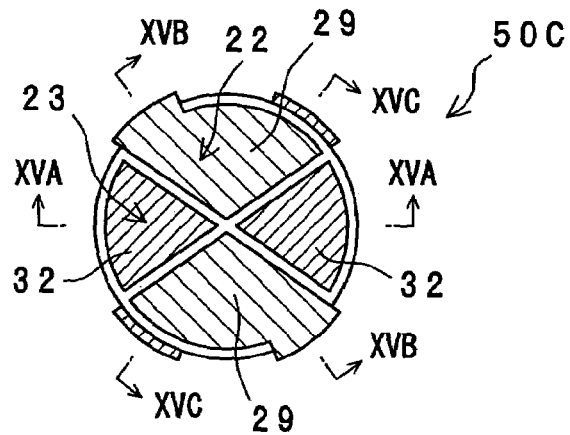
FIG. 14 is a top plan view of a piezoelectric transformer according to a third embodiment of the present invention.
Figure 15A:
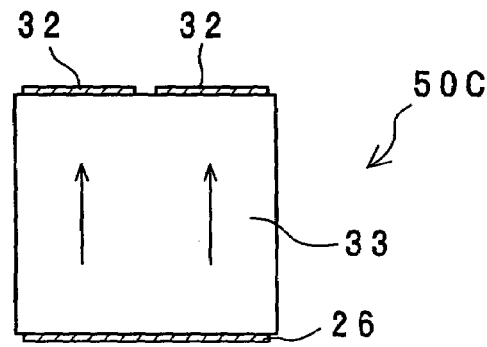
FIGS. 15A, 15B and 15C are sectional views taken along the lines XVA—XVA, XVB—XVB and XVC—XVC in FIG. 14, respectively.
Figure 15B:
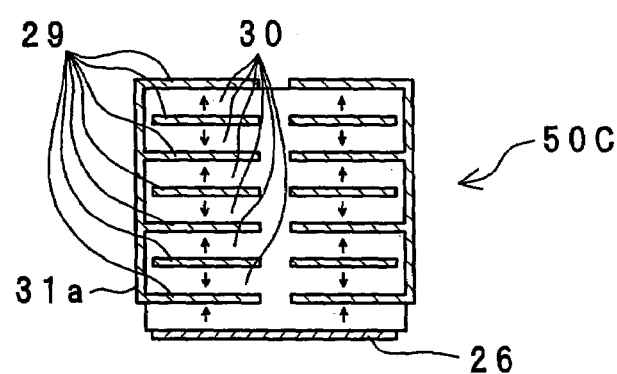
Figure 15C:
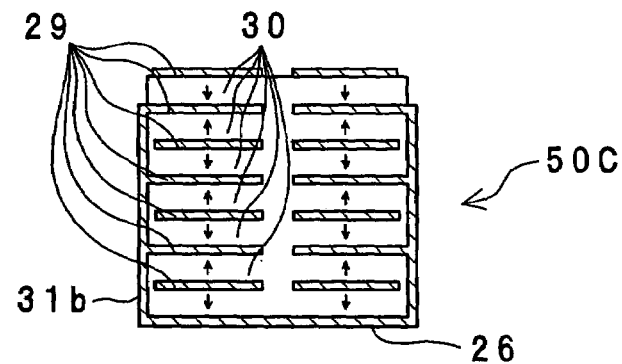

FIG. 14 is a top plan view of a piezoelectric transformer 50C according to a third embodiment of the present invention. FIGS. 15A, 15B and 15C are sectional views taken along the lines XVA—XVA, XVB—XVB and XVC—XVC in FIG. 14, respectively. As shown in FIG. 15B, electrode layers 29 and piezoelectric layers 30 are alternately laminated on each other in a thickness direction of each of the low-impedance portions 22. The electrode layers 29 are in every other place exposed to one side wall face of the piezoelectric layers 30 so as to be connected to a side electrode 31a formed on the one side wall face of the piezoelectric layers 30. Meanwhile, as shown in FIG. 15C, the remaining electrode layers 29 are exposed to the other side wall face of the piezoelectric layers 30 so as to be connected to a side electrode 31b formed on the other side wall face of the piezoelectric layers 30.

As shown in FIGS. 14 and 15, the number of lamination of the electrode layers of the high-impedance portions 23 is smaller than that of the low-impedance portions 22 and a set of the electrodes for the driving portion are constituted by an electrode layer 32 and the common electrode 26 which interpose a piezoelectric layer 33 therebetween.

In this embodiment, by adjusting not only a ratio between an area of the electrodes for the driving portion and that of the electrodes for the generator portion is adjusted in the same manner as the first embodiment but the number of lamination of the electrode layers at the driving portion and that of the electrode layers at the generator portion as described above, an impedance ratio between the low-impedance portion 22 and the high-impedance portion 23 is adjusted.

Meanwhile, as shown in FIGS. 15A to 15C, even if the electrode layers are laminated at the driving portion and the generator portion, the electrode layers at the driving portion and the generator portion are exposed to the side wall face and upper and lower faces of the piezoelectric layer and thus, it is easy to perform electrical connection in contrast with prior art shown in FIG. 27A.

Figure 16A:
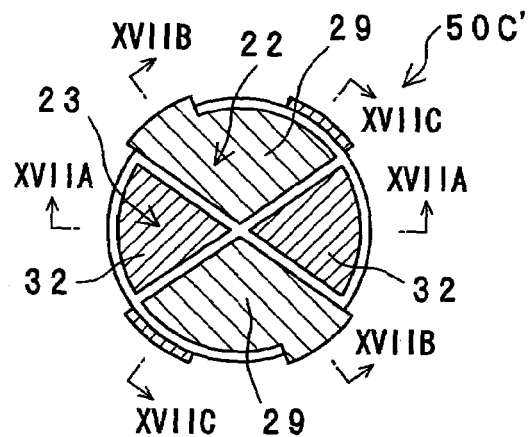
FIGS. 16A and 16B are a top plan view and a bottom plan view of a piezoelectric transformer which is a modification of the piezoelectric transformer of FIG. 14, respectively.
Figure 16B:
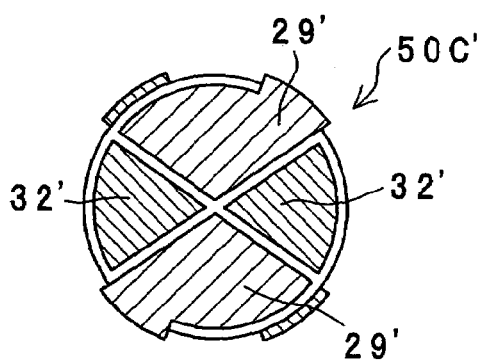
Figure 17A:
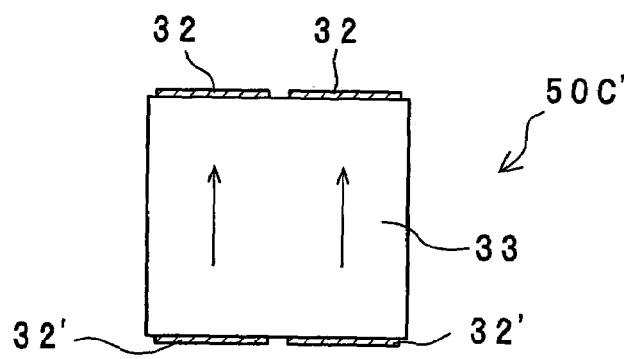
FIGS. 17A, 17B and 17C are sectional views taken along the lines XVIIA—XVIIA, XVIIB—XVIIB and XVIIC—XVIIC in FIG. 16A, respectively.
Figure 17B:
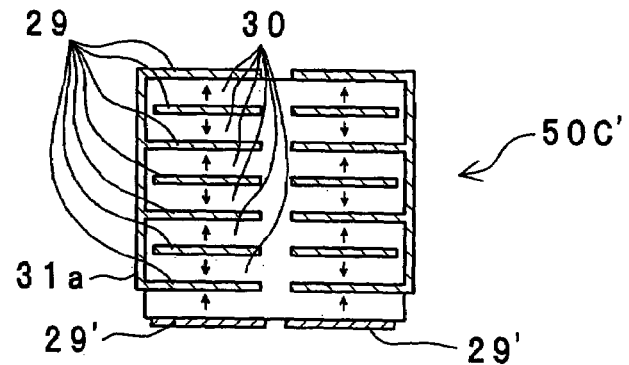
Figure 17C:
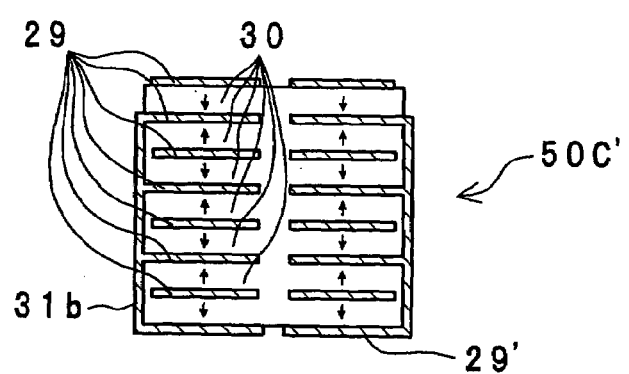

FIGS. 16A and 16B are a top plan view and a bottom plan view of a piezoelectric transformer 50C' which is a modification of the piezoelectric transformer 50C, respectively. FIGS. 17A, 17B and 17C are sectional views taken along the lines XVIIA—XVIIA, XVIIB—XVIIB and XVIIC—XVIIC in FIG. 16A, respectively. The piezoelectric transformer 50C' is different from the piezoelectric transformer 50C in that the common electrode 26 on the other face of the piezoelectric ceramic disc of the piezoelectric transformer 50C is divided into electrodes 29' for the low-impedance portion and electrodes 32' for the high-impedance portion and the electrodes 29' are electrically separated from the electrodes 32'. The electrodes 29' are electrically separated from the electrodes 32' as described above. Hence, even if a noisy signal is introduced in, for example, between the electrodes 32 and 32' at the driving portion, the noise is not picked up between the electrodes 29 and 29' at the generator portion.

Meanwhile, in the piezoelectric transformers 50C and 50C', the high-impedance portions 23 include the single electrode layer 32 but may also be, needless to say, modified to include a plurality of laminated electrode layers 32.

(Fourth Embodiment)

Figure 18:
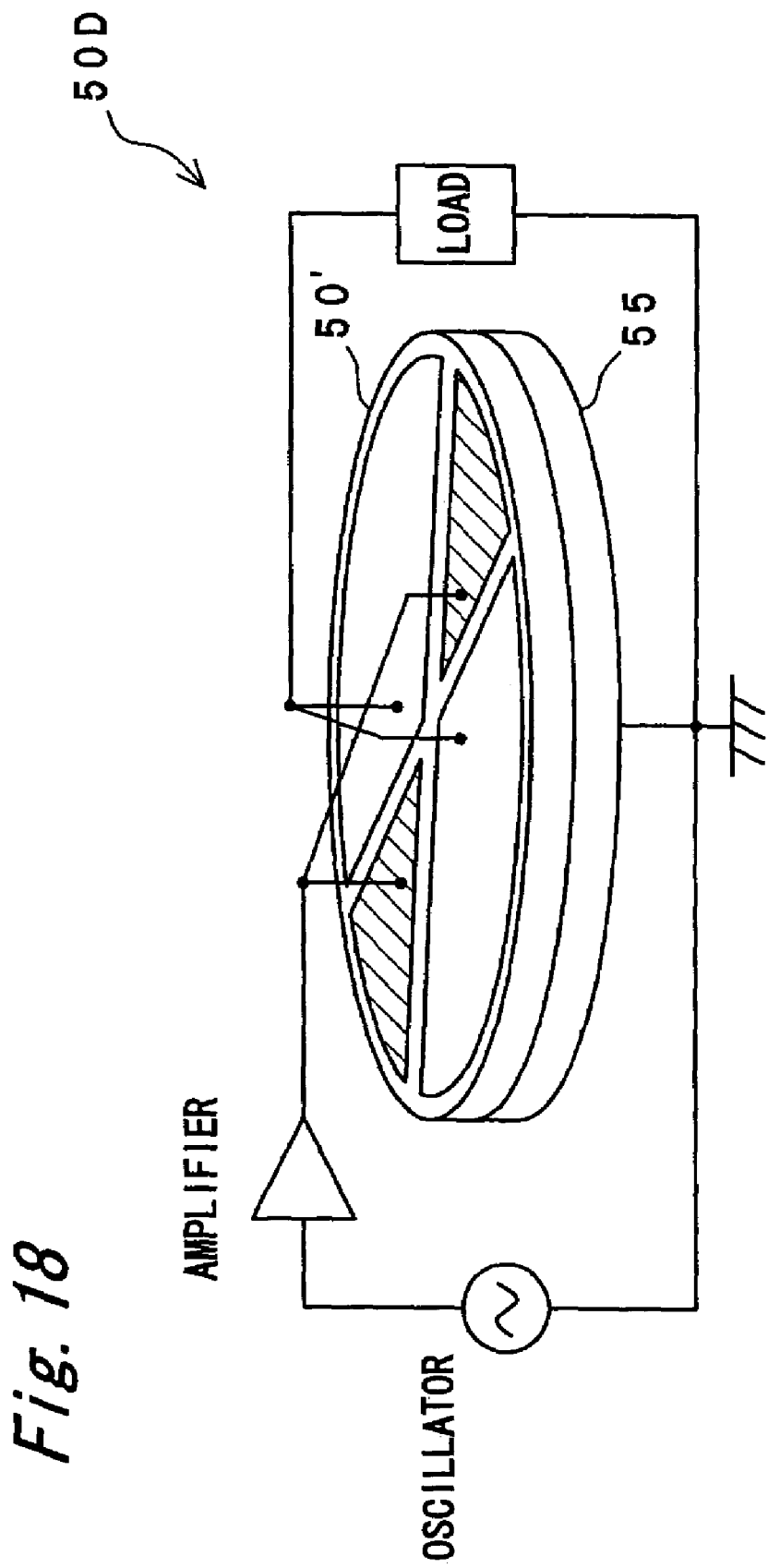
FIG. 18 is a perspective view of a piezoelectric transformer according to a fourth embodiment of the present invention.

FIG. 18 is a perspective view of a piezoelectric transformer 50D according to a fourth embodiment of the present invention. The piezoelectric transformer 50D includes a piezoelectric transformer body 50' acting as one of the piezoelectric transformers 50A to 50C of the first to third embodiments, for example, the piezoelectric transformer 50A of the first embodiment and a metallic disc 55 bonded to a whole of a lower face of the piezoelectric transformer body 50'.

For example, thicknesses of the piezoelectric transformer body 50' and the metallic disc 55 are set such that a maximum stress of the piezoelectric transformer 50D is produced in the metallic disc 55. By the above described setting, since the maximum stress is produced in the disc 55 made of metal capable of withstanding a distortion larger than that of piezoelectric substance forming the piezoelectric transformer body 50', the piezoelectric transformer 50D can be operated at an amplitude larger than that of the piezoelectric transformer made of piezoelectric substance only, namely, one of the piezoelectric transformers 50A to 50C of the first to third embodiments. As a result, the piezoelectric transformer 50D of this embodiment is capable of handling larger electric power.

Meanwhile, the metallic disc 55 is employed in this embodiment. However, the present invention is not limited to the metallic disc 55. If a material other than metal is capable of withstanding a distortion larger than that of the piezoelectric substance of the piezoelectric transformer body 50', it is needless to say that the metallic disc 55 may be replaced by a disc made of the material.

(Fifth Embodiment)

Figure 19:
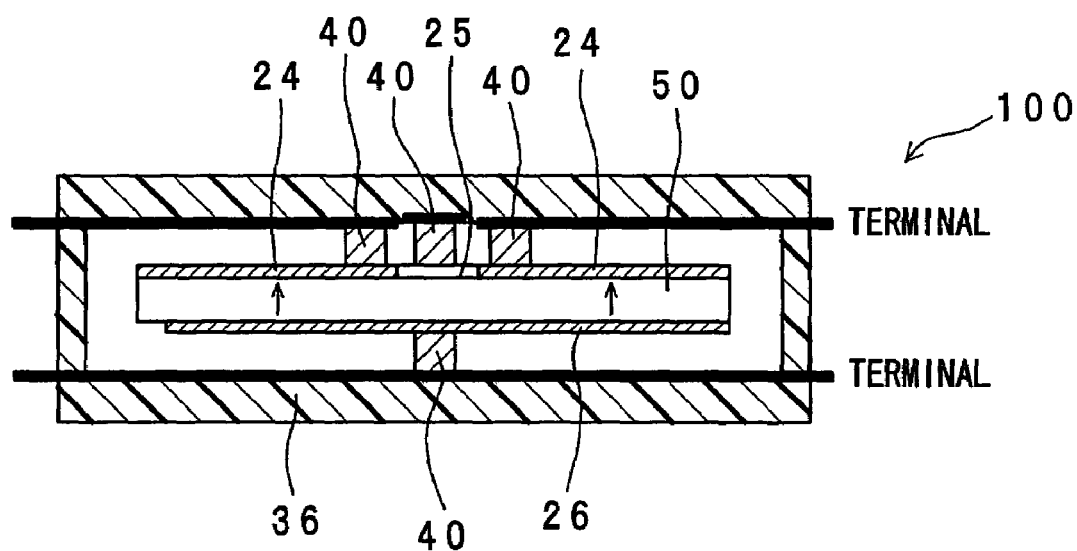
FIG. 19 is a sectional view of a piezoelectric transformer unit according to a fifth embodiment of the present invention.

FIG. 19 is a sectional view of a piezoelectric transformer unit 100 according to a fifth embodiment of the present invention. The piezoelectric transformer unit 100 includes a piezoelectric transformer 50 and support members 40 for supporting the piezoelectric transformer 50, which are made of electrically conductive elastic material. The piezoelectric transformer 50 is formed by, for example, the piezoelectric transformer 50A of the first embodiment. The piezoelectric transformer 50 and the support members 40 are accommodated in a casing 36. The support members 40 support the piezoelectric transformer 50 through their contact with the piezoelectric transformer 50 in the vicinity of the center of the disc corresponding to the node of vibration at the time the piezoelectric transformer 50 is operated in the radial extensional vibration mode of the disc. At points of contact of the support members 40 with the piezoelectric transformer 50, the support members 40 perform input-output operation of electric power in the piezoelectric transformer 50.

In this embodiment, since support and electrical connection of the piezoelectric transformer 50 are performed in the vicinity of the center of the disc corresponding to the node of vibration by using the support members 40 made of electrically conductive elastic material, vibration loss due to both support of the piezoelectric transformer 50 and input-output operation of electric power in the piezoelectric transformer 50 by the support members 40 can be restrained.

(Sixth Embodiment)

Figure 20:
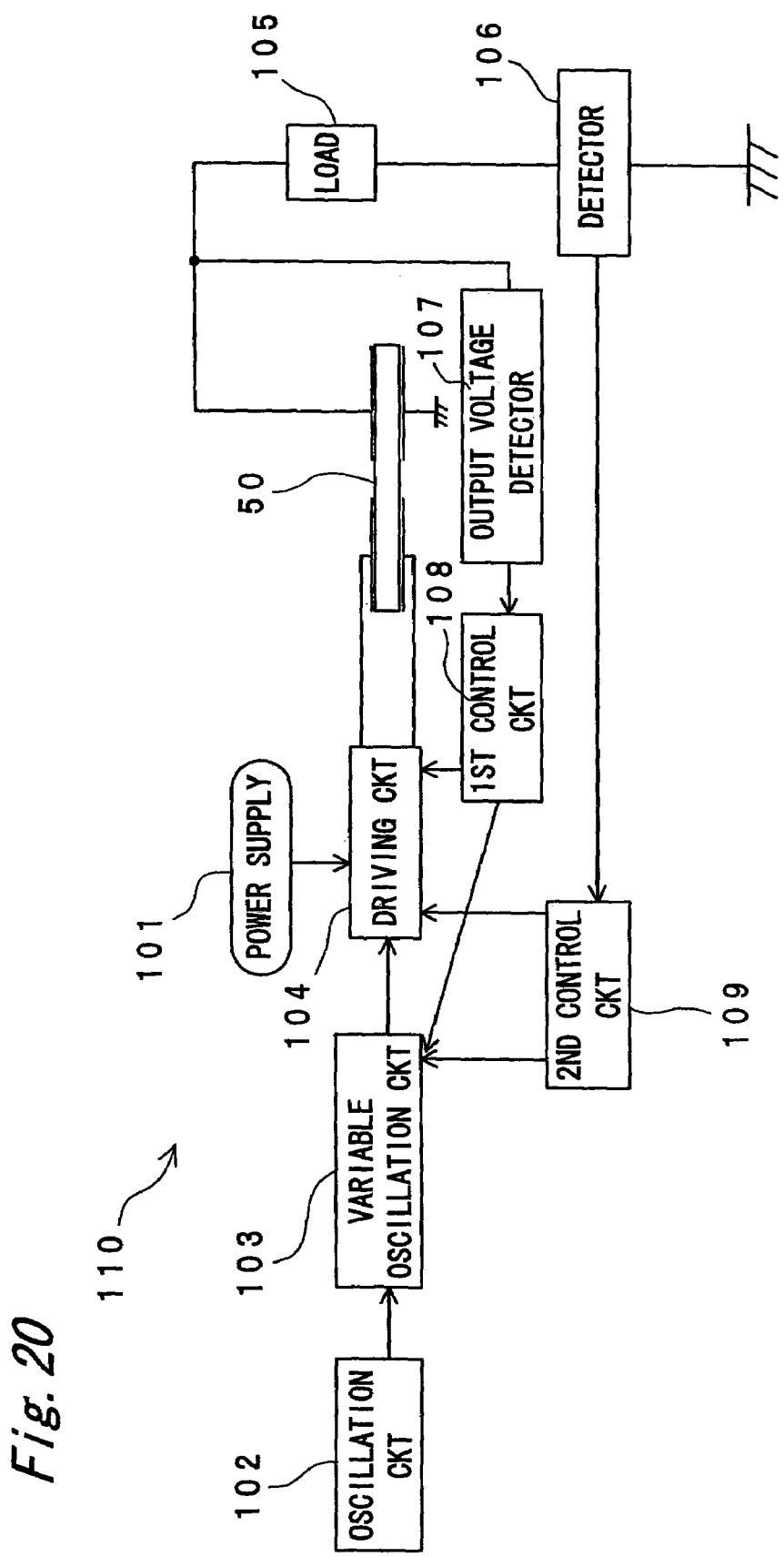
FIG. 20 is a block diagram of a power supply circuit according to a sixth embodiment of the present invention.

FIG. 20 is a block diagram of a power supply circuit 110 according to a sixth embodiment of the present invention. In the power supply circuit 110, a piezoelectric transformer 50 which is formed by one of the piezoelectric transformers 50A to 50D of the first to fourth embodiments is used as a step-up circuit. The power supply circuit 110 includes a power supply 101, an oscillation circuit 102, a variable oscillation circuit 103, a driving circuit 104, a load 105, a detector 106, an output voltage detector 107, a first control circuit 108 and a second control circuit 109. In the power supply circuit 110, an input circuit for supplying an input power to the piezoelectric transformer 50 is constituted by the components 101 to 104, while an output circuit for picking up an output power from the piezoelectric transformer 50 is constituted by the components 105 to 109.

A frequency signal is generated by the variable oscillation circuit 103 and a drive signal of the piezoelectric transformer 50 is produced by the driving circuit 104. The piezoelectric transformer 50 is controlled on the basis of a detection signal of the detector 106 by the second control circuit 109 via the variable oscillation circuit 103 and the driving circuit 104 such that the piezoelectric transformer 50 can be stably driven in response to change of voltage applied to the load 105 connected to the electrodes of the generator portion of the piezoelectric transformer 50. In case the load 105 is a tube such as a cold cathode tube and a hot cathode tube, the voltage output detector 107 is operated until the tube is turned on. Thus, when electric current starts flowing through the tube, the output voltage detector 107 stops its operation. The first control circuit 108 controls output voltage such that the output voltage does not exceed a preset value.

In case the piezoelectric transformer 50 of the present invention is used for a step-up inverter circuit, it is possible to obtain a circuit having a circuit efficiency higher than that of a step-up circuit employing an electromagnetic transformer because the driving efficiency of the piezoelectric transformer 50, is higher than that of the electromagnetic transformer. Meanwhile, since electrical energy handled by a unit volume of the piezoelectric transformer 50 of the present invention is larger than that of the electromagnetic transformer, volume of the piezoelectric transformer 50 can be reduced and the step-up circuit can be made thin by shape of the piezoelectric circuit 50. In addition, the piezoelectric transformer 50 utilizes the radial extensional vibration mode of the disc and thus, is capable of handling large electric power.

Figure 21:
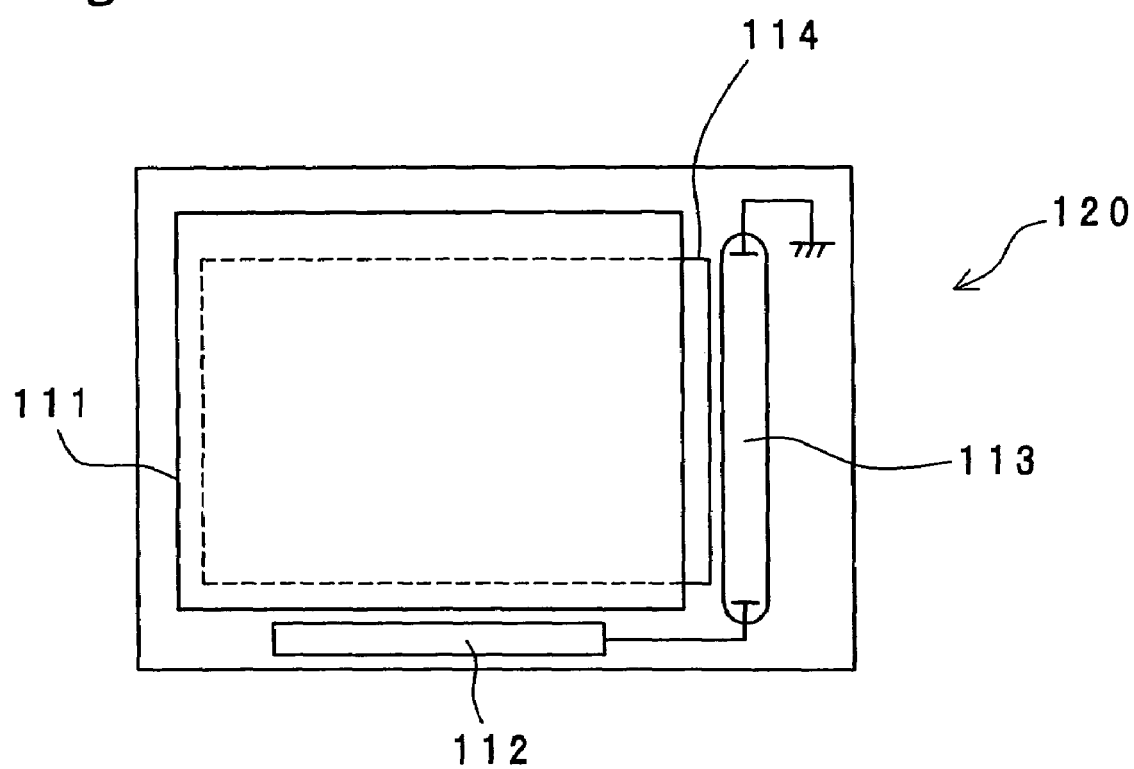
FIG. 21 is a schematic front elevational view of a liquid crystal display including a cold cathode tube type lighting unit acting as the power supply circuit of FIG. 20.

FIG. 21 shows a liquid crystal display 120 incorporating a cold cathode tube type lighting unit formed by the power supply circuit 110 of FIG. 20. The cold cathode tube type lighting unit is formed by a piezoelectric transformer inverter circuit 112 which is obtained by deleting the load 105 from the power supply circuit 110 of FIG. 20 and a cold cathode tube 113 acting as the load 105 of the power supply circuit 110 of FIG. 20. Thus, in this cold cathode tube type lighting unit, an input circuit for supplying an input power to the piezoelectric transformer 50 is constituted by the components 101 to 104 of the power supply circuit 110, while an output circuit for picking up an output power from the piezoelectric transformer 50 is constituted by the cold cathode tube 113 and the components 106 to 109 of the power supply circuit 110. In the liquid crystal display 120, a liquid crystal panel 111 is illuminated by the cold cathode tube type light unit of the above described arrangement through a light guide plate 114 provided at a back of the liquid crystal panel 111.

In the conventional electromagnetic transformer, a high voltage at the time of start of turning on of the cold cathode tube 113 should be outputted at all times. On the other hand, in the liquid crystal display 120, since the piezoelectric transformer 50 of the present invention is used, output voltage of the piezoelectric transformer 50 changes according to load variations at the time of start of turning on of the cold cathode tube 113 and during on-state period of the cold cathode tube 113, so that other circuits existing in the liquid crystal display 120 are not adversely affected by the load variations. Meanwhile, since output voltage applied to the cold cathode tube 113 from the piezoelectric transformer 50 in the piezoelectric transformer inverter circuit 112 has substantially sine wave, unnecessary frequency components which do not contribute to turning on of the cold cathode tube 113 are little in the output voltage.

(Seventh Embodiment)

Figure 22:
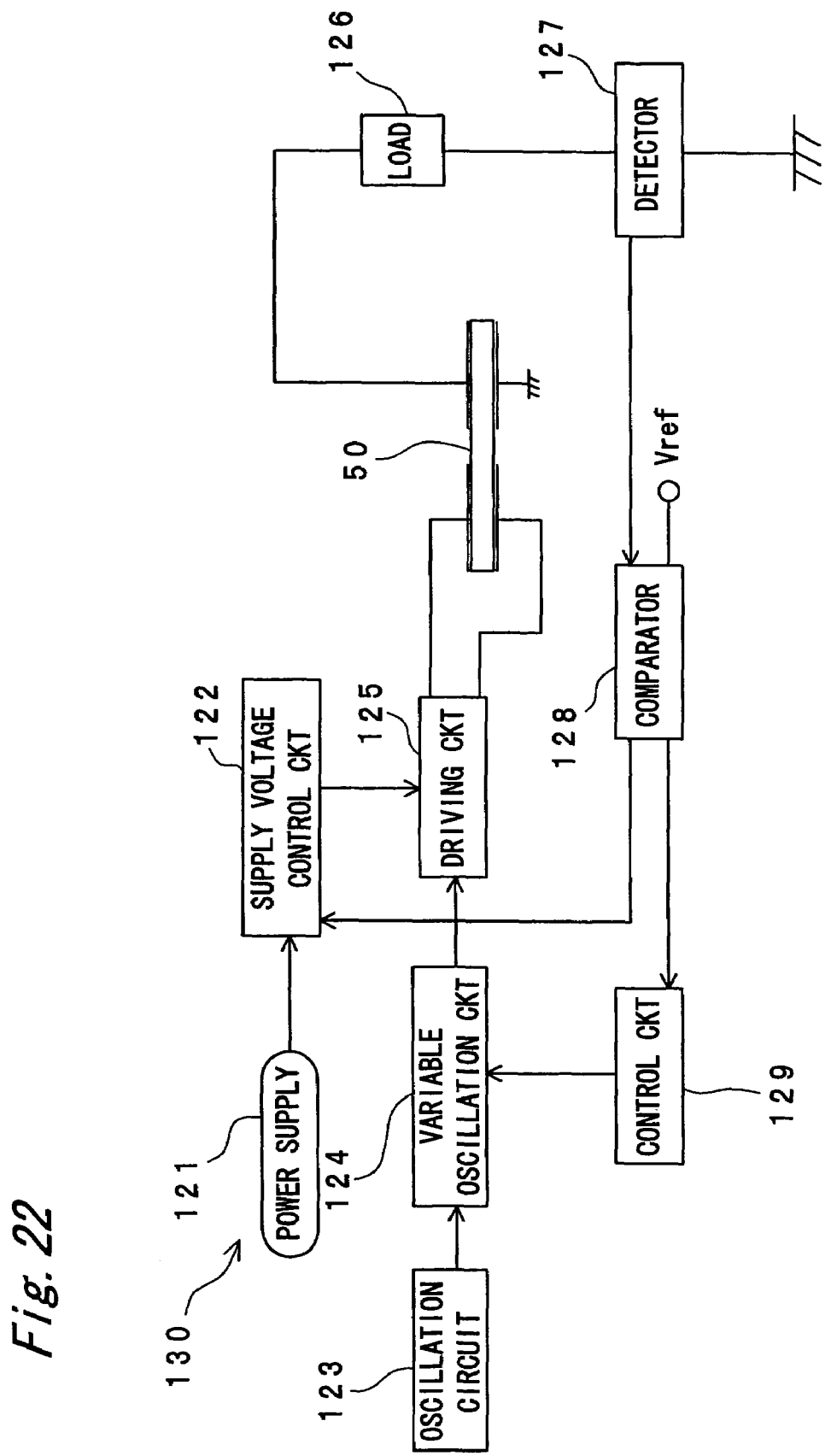
FIG. 22 is a block diagram of a power supply circuit according to a seventh embodiment of the present invention.

FIG. 22 is a block diagram of a power supply circuit 130 according to a seventh embodiment of the present invention. The power supply circuit 130 uses a piezoelectric transformer 50 formed by one of the piezoelectric transformers 50A to 50D of the first to fourth embodiments and includes a power supply 121, a supply voltage control circuit 122, an oscillation circuit 123, a variable oscillation circuit 124, a driving circuit 125, a load 126, a detector 127, a comparator 128 and a control circuit 129. A reference frequency is produced by the oscillation circuit 123. The comparator 128 compares an output from the detector 127 with a set voltage Vref so as to control one or both of a supply voltage for the supply voltage control circuit 122 and a driving frequency for the control circuit 129. In response to control of the driving frequency by the control circuit 129 and control of the supply voltage by the supply voltage control circuit 122, the driving circuit 125 performs power amplification for driving the piezoelectric transformer 50. Meanwhile, the driving circuit 125 is formed by a switching element and a filter circuit. The load 126 is, for example, a cathode discharge tube.

Since electrical energy handled by a unit volume of the piezoelectric transformer 50 of the present invention is larger than that of the electromagnetic transformer, volume of the piezoelectric transformer 50 can be reduced and the step-up circuit can be made thin by shape of the piezoelectric circuit 50. In addition, the piezoelectric transformer 50 utilizes the radial extensional vibration mode of the disc and thus, is capable of handling large electric power.

(Eighth Embodiment)

Figure 23:
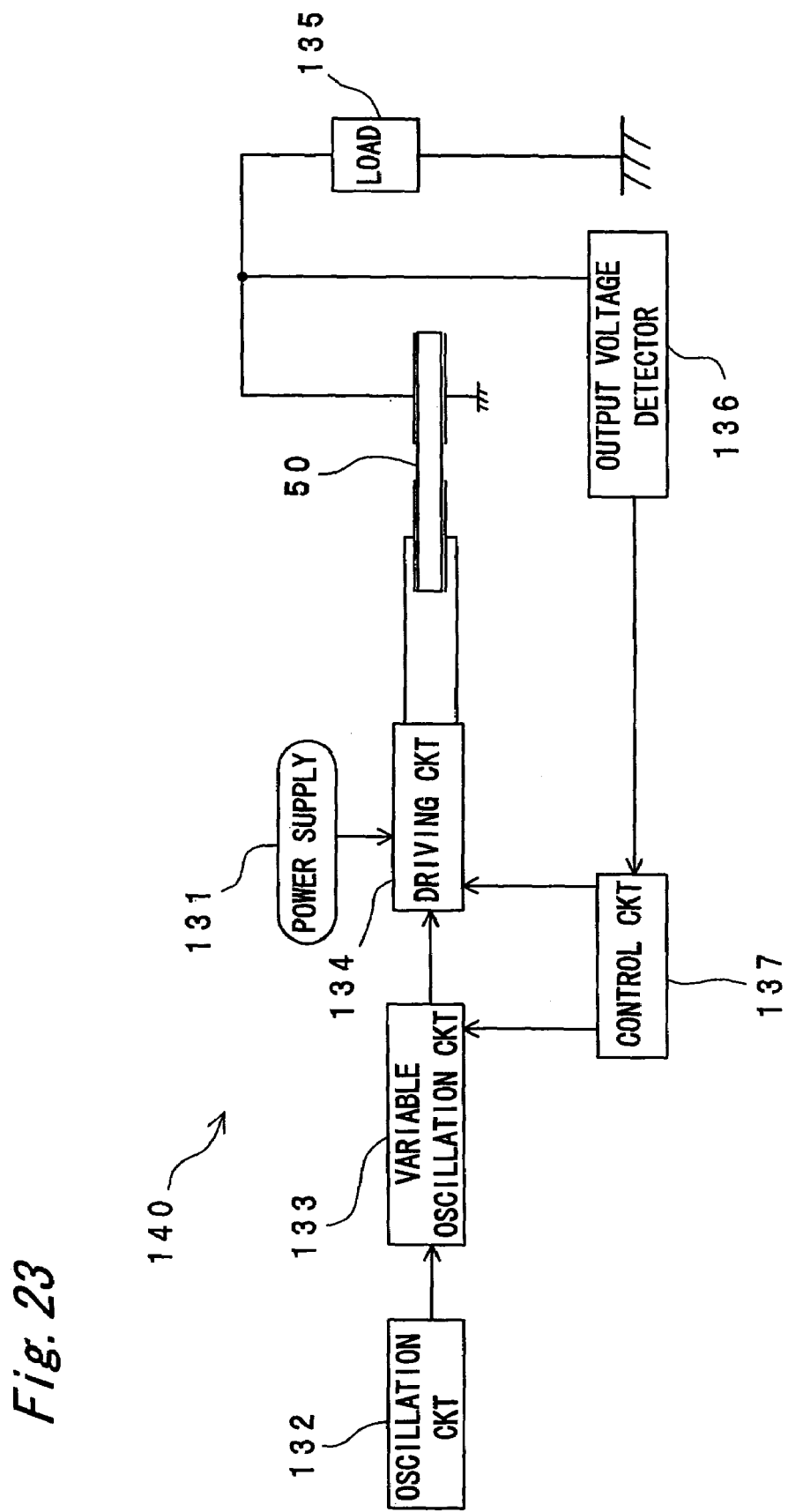
FIG. 23 is a block diagram of a power supply circuit according to an eighth embodiment of the present invention.
Figure 24:
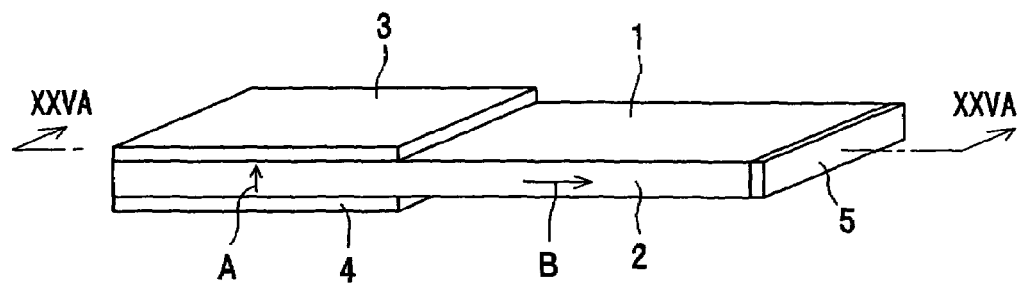
FIG. 24 is a perspective view of a prior art Rosen type piezoelectric transformer.
Figure 25A:
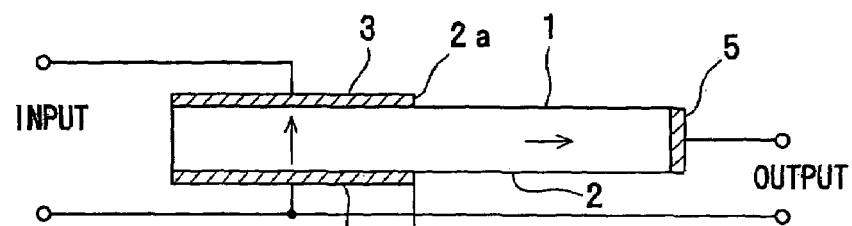
FIG. 25A is a sectional view taken along the line XXVA—XXVA in FIG. 24 and FIGS. 25B, 25C and 25D are views showing displacement distribution, stress distribution and electric charge distribution at the time of (½)—wavelength vibration of expansion and contraction of the prior art piezoelectric transformer of FIG. 24, respectively.
Figure 25B:
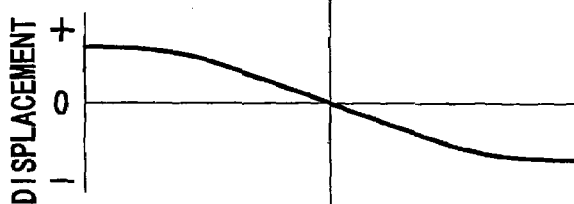
Figure 25C:
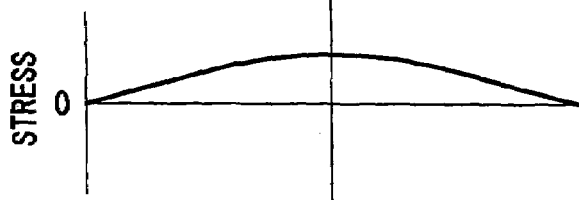
Figure 25D:
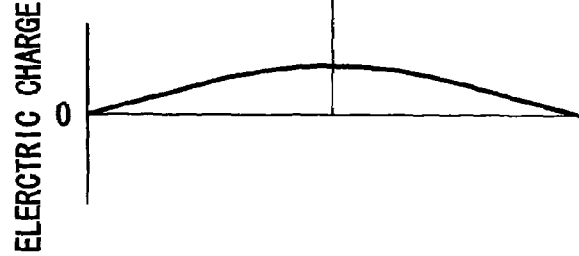

FIG. 23 is a block diagram of a power supply circuit 140 according to an eighth embodiment of the present invention. The power supply circuit 140 uses one of the piezoelectric transformers 50A to 50D of the first to fourth embodiments and includes a power supply 131, an oscillation circuit 132, a variable oscillation circuit 133, a driving circuit 134, a load 135, an output voltage detector 136 and a control circuit 137. The load 135 connected to the piezoelectric transformer 50 is formed by a rectifier circuit.

In this embodiment, output voltage, i.e., voltage applied to the load 135 can be controlled so as to be kept constant. Since electrical energy handled by a unit volume of the piezoelectric transformer 50 of the present invention is larger than that of the electromagnetic transformer, volume of the piezoelectric transformer 50 can be reduced and the piezoelectric transformer 50 can be made thin by its shape. In addition, the piezoelectric transformer 50 utilizes the radial extensional vibration mode of the disc and thus, is capable of handling large electric power.

Meanwhile, in the above embodiments, the high-impedance portions are used as the driving portion and the low-impedance portions are used as the generator portion by way of example. However, in the present invention, the low-impedance portions and the high-impedance portions may also be reversely used as the driving portion and the generator portion, respectively.

As is clear from the foregoing description, the following marked effects are gained in the present invention. In the piezoelectric transformer of the present invention, since the radial extensional vibration mode of the piezoelectric ceramic disc is utilized, the electromechanical coupling factor increases, so that electric power per unit volume and output electric current is increased. Meanwhile, since a pair of the low-impedance portions acting as one of the driving portion and the generator portion are disposed symmetrically with respect to the central axis of the disc and a pair of the high-impedance portions acting as the other of the driving portion and the generator portion are disposed symmetrically with respect to the central axis of the disc, the effective electromechanical coupling factor keff based on the electrodes of the driving portion increases.

In the power supply circuit of the present invention, since the piezoelectric transformer capable of increasing electric power per unit volume and output electric current is employed, it is possible to meet a demand for a higher rated power of a tube having a longer dimension and a higher luminance.

Furthermore, in the lighting unit of the present invention, since the piezoelectric transformer capable of increasing electric power per unit volume and output electric current is employed, it is possible to meet a demand for a higher rated power of a tube having a longer dimension and a higher luminance.

What is claimed is:

1. A piezoelectric transformer comprising:
a piezoelectric ceramic disc which has one face and the other face opposite to each other in a thickness direction;
a pair of low-impedance portions which are disposed in the piezoelectric ceramic disc symmetrically with respect to a central axis of the piezoelectric ceramic disc so as to act as one of a driving portion and a generator portion; and
a pair of high-impedance portions which are disposed in the piezoelectric ceramic disc symmetrically with respect to the central axis so as to be electrically separated from the low-impedance portions and act as the other of the driving portion and the generator portion; and
an electrode member and a further electrode member which are, respectively, provided on the one face and the other face of the piezoelectric ceramic disc such that the piezoelectric ceramic disc is polarized only in the thickness direction between said electrode member and said further electrode member;
wherein the piezoelectric transformer is adapted to be driven in a radial extensional vibration mode of the piezoelectric ceramic disc.

2. The piezoelectric transformer as claimed in claim 1, wherein the electrode member includes a pair of first electrodes disposed in the low-impedance portions symmetrically with respect to the central axis and a pair of second electrodes disposed in the high-impedance portions symmetrically with respect to the central axis so as to be electrically separated from the first electrodes;
wherein the further electrode member includes a common electrode disposed at a position corresponding to those of the first electrodes and the second electrodes.

3. The piezoelectric transformer as claimed in claim 2, wherein each of the first electrodes extends on the one face of the piezoelectric ceramic disc radially from the central axis towards a peripheral edge of the piezoelectric ceramic disc and each of the second electrodes extends on the one face of the piezoelectric ceramic disc radially from the central axis towards the peripheral edge of the piezoelectric ceramic disc.

4. The piezoelectric transformer as claimed in claim 2, wherein a first region free from the first electrodes and the second electrodes is formed at a central portion of the one face of the piezoelectric ceramic disc so as to be brought into contact with a first support member and a second region free from the common electrode is formed at a central portion of the other face of the piezoelectric ceramic disc so as to be brought into contact with a second support member.

5. The piezoelectric transformer as claimed in claim 1, wherein the electrode member includes a pair of first electrodes disposed in the low-impedance portions symmetrically with respect to the central axis and electrically connected to a first terminal acting as an electric current input-output port for the low-impedance portions and the further electrode member includes a pair of second electrodes disposed in the low-impedance portions symmetrically with respect to the central axis and electrically connected to a second terminal acting as a further electric current input-output port for the low-impedance portions;
wherein the electrode member includes a pair of third electrodes disposed in the high-impedance portions symmetrically with respect to the central axis so as to be electrically separated from the first electrodes such that the third electrodes are electrically connected to a third terminal acting as an electric current input-output port for the high-impedance portions and the further electrode member includes a pair of fourth electrodes disposed in the hich-impedance portions symmetrically with respect to the central axis so as to be electrically separated from the second electrodes such that the fourth electrodes are electrically connected to a fourth terminal acting as a further electric current input-output port for the high-impedance portions.

6. The piezoelectric transformer as claimed in claim 5, wherein each of the first electrodes extends on the one face of the piezoelectric ceramic disc radially from the central axis towards a peripheral edge of the piezoelectric ceramic disc and each of the second electrodes extends on the other face of the piezoelectric disc radially from the central axis towards the peripheral edge of the piezoelectric ceramic disc;
wherein each of the third electrodes extends on the one face of the piezoelectric ceramic disc radially from the central axis towards the peripheral edge of the piezoelectric ceramic disc and each of the fourth electrodes extends on the other face of the piezoelectric ceramic disc radially from the central axis towards the peripheral edge of the piezoelectric ceramic disc.

7. The piezoelectric transformer as claimed in claim 5, wherein a first region free from the first electrodes and the third electrodes is formed at a central portion of the one face of the piezoelectric ceramic disc so as to be brought into contact with a first support member and a second region free from the second electrodes and the fourth electrodes is formed at a central portion of the other face of the piezoelectric ceramic disc so as to be brought into contact with a second support member.

8. The piezoelectric transformer as claimed in claim 1, further comprising;
a support member for supporting the piezoelectric transformer in the vicinity of a node of vibration at the time of drive of the piezoelectric transformer in the radial extensional vibration mode of the piezoelectric ceramic disc.

9. The piezoelectric transformer as claimed in claim 1, wherein electrical connection in the low-impedance portions and electrical connection in the high-impedance portions are performed in the vicinity of a node of vibration at the time of drive of the piezoelectric transformer in the radial extensional vibration mode of the piezoelectric ceramic disc.

10. The piezoelectric transformer as claimed in claim 1, further comprising:
a support member for supporting the piezoelectric transformer, which is made of electrically conductive elastic material;
wherein the support member is brought into contact with the piezoelectric transformer in the vicinity of a node of vibration at the time of drive of the piezoelectric transformer in the radial extensional vibration mode of the piezoelectric ceramic disc so as to support the piezoelectric transformer and performs electric power input-output operation in the piezoelectric transformer at a point of contact of the support member with the piezoelectric transformer.

11. The piezoelectric transformer as claimed in claim 1, further comprising:
a metallic disc which has a dimension substantially identical with that of the piezoelectric ceramic disc and is bonded to one of the one face and the other face of the piezoelectric ceramic disc.

12. A power supply circuit comprising:

a piezoelectric transformer including a piezoelectric ceramic disc which has one face and the other face opposite to each other in a thickness direction, a pair of low-impedance portions which are disposed in the piezoelectric ceramic disc symmetrically with respect to a central axis of the piezoelectric ceramic so as to act as one of a driving portion and a generator portion and a pair of high-impedance portions which are disposed in the piezoelectric ceramic disc symmetrically with respect to the central axis so as to be electrically separated from the low-impedance portions and act as the other of the driving portion and the generator portion and an electrode member and a further electrode member which are respectively, provided on the one face and the other face of the piezoelectric ceramic disc such that the piezoelectric ceramic disc is polarized in the thickness direction only, wherein the piezoelectric transformer is adapted to be driven in a radial extensional vibration mode of the piezoelectric ceramic disc;

an input circuit for supplying an input electric power to the piezoelectric transformer; and an output circuit for picking up an output electric power from the piezoelectric transformer.

13. A lighting unit comprising:

a piezoelectric transformer including a piezoelectric ceramic disc which has one face and the other face opposite to each other in a thickness direction;

a pair of low-impedance portions which are disposed in the piezoelectric ceramic disc symmetrically with respect to a central axis of the piezoelectric ceramic disc so as to act as one of a driving portion and a generator portion and a pair of high-impedance portions which are disposed in the piezoelectric ceramic disc symmetrically with respect to the central axis so as to be electrically separated from the low-impedance portions and act as the other of the driving portion and the generator portion; and an electrode member and a further electrode member which are. respectively, provided on the one face and the other face of the piezoelectric ceramic disc such that the piezoelectric ceramic disk is polarized in the thickness direction only, wherein the piezoelectric transformer is adapted to be driven in a radial extensional vibration mode of the piezoelectric ceramic disc;

an input circuit for supplying an input electric power to the piezoelectric transformer; and an output circuit for picking up an output electric power from the piezoelectric transformer.

* * * * *

UNITED STATES PATENT AND TRADEMARK OFFICE
CERTIFICATE OF CORRECTION

| | |
|---|---|
| PATENT NO. | : 7,202,592 B2 |
| APPLICATION NO. | : 10/843015 |
| DATED | : April 10, 2007 |
| INVENTOR(S) | : Katsu Takeda et al. |

Page 1 of 1

It is certified that error appears in the above-identified patent and that said Letters Patent is hereby corrected as shown below:

Column 16
Line 4, change "hich-" to -- high- --

Column 17
Line 16, after "are" add -- , --

Column 18
Line 16, change "are." to -- are, --

Signed and Sealed this

Seventh Day of August, 2007

JON W. DUDAS
*Director of the United States Patent and Trademark Office*